United States Patent [19]

Yoffa et al.

[11] Patent Number: 4,742,471
[45] Date of Patent: May 3, 1988

[54] METHOD FOR IMPROVING WIRABILITY OF MASTER-IMAGE DCVS CHIPS

[75] Inventors: Ellen J. Yoffa, Mount Kisco; Peter S. Hauge, Yorktown Heights, both of N.Y.

[73] Assignee: International Business Machines Corporation, Armonk, N.Y.

[21] Appl. No.: 793,595

[22] Filed: Oct. 31, 1985

[51] Int. Cl.$^4$ .............................................. G06F 15/60
[52] U.S. Cl. .................................... 364/491; 364/490; 364/300
[58] Field of Search ............... 364/300, 488, 489, 490, 364/491

[56] References Cited

U.S. PATENT DOCUMENTS

| | | | |
|---|---|---|---|
| 4,593,363 | 6/1986 | Burnstein et al. | 364/491 |
| 4,607,339 | 8/1986 | Davis | 364/491 |
| 4,608,649 | 8/1986 | Daud et al. | 364/491 |
| 4,613,941 | 9/1986 | Smith et al. | 364/490 |
| 4,615,010 | 9/1986 | Davis et al. | 364/491 |
| 4,630,219 | 12/1986 | DiGiacomo et al. | 364/488 |
| 4,636,965 | 1/1987 | Smith et al. | 364/491 |

OTHER PUBLICATIONS

Hague and Montoye, "Two-Dimensional Layout of CVS Single-Ended Trees in Masterslice and Means for Realizing a Compact Master Image Layout Using Two-Dimensional Diffusion Wiring," *IBM Technical Disclosure Bulletin*, vol. 27, No. 7A, Dec. 1984, pp. 3775-3781.

Hague and Yoffa, "Method for Improving Cascode Switch Design", *IBM Technical Disclosure Bulletin*, vol. 27, No. 3, Aug. 1984, pp. 1572-1578.

Primary Examiner—Parshotam S. Lall
Assistant Examiner—Daniel W. Juffernbruch
Attorney, Agent, or Firm—Roy R. Schlemmer

[57] ABSTRACT

A method for increasing the wirability of complementary metal oxide semiconductor (CMOS) differential cascode voltage switch (DCVS) logic circuits which comprises designing the circuitry to permit as many of the internal tree connections as possible to be wired using diffusion techniques. The method utilizes differential pair and load microblocks which have been designed so as to allow mirroring on a vertical center line. Utilizing the availability of mirroring for individual pairs plus relocation of individual pairs in the logic tree the crossings may be largely eliminated in a shortened period. It utilizes a step by step row and column analysis of the initial or starting tree design resulting from the basic Boolean logic to be performed by the particular circuit and makes required load mirroring and differential pair relocation decisions in an iterative process. The transistor pairs and load devices may be mirrored about a vertical center line. That is, they have an alternate configuration or layout in which left and right are reversed. The effect of mirroring is to reverse the points of connection for the true and complement inputs to the load, and to reverse the true and complement output locations of the pairs, WITHOUT switching the horizontal wiring tracks occupied by the inputs to the pairs, or outputs from the loads.

10 Claims, 9 Drawing Sheets

FIG. 5A
FIG. 5B
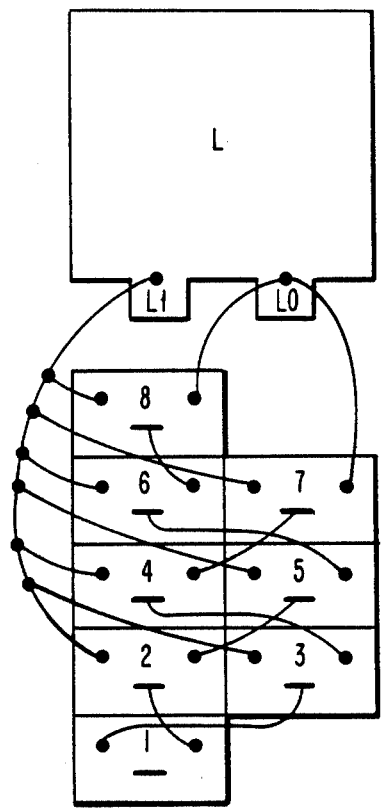
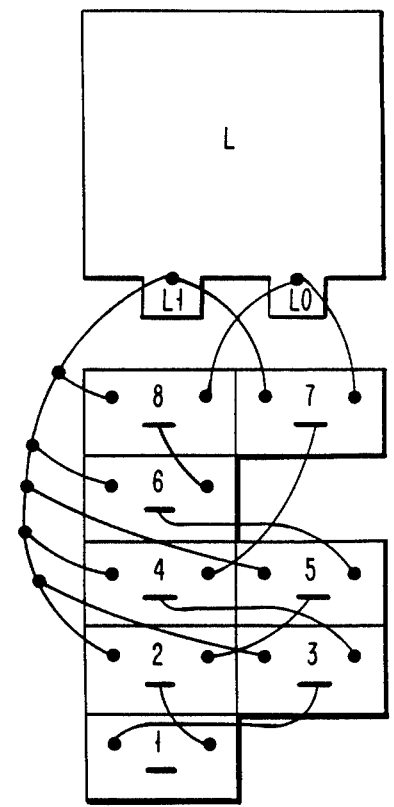

METHOD FOR IMPROVING WIRABILITY OF MASTER-IMAGE DCVS CHIPS

BACKGROUND OF THE INVENTION

The present invention relates generally to the area of automated very large scale integrated circuit technology. More particularly, it relates to the optimized design of Differential Cascode Voltage Switch (DCVS) logic trees implemented in complementary metal oxide semiconductor (CMOS) technology. It relates still more particularly to a method for improving the wirability, reliability and ease of manufacture of such circuits.

Differential cascode voltage switch (DCVS) trees are high performance, high functionality CMOS circuits, which, because they have a large number of inputs and internal connections are difficult to wire on a large scale.

Differential cascode voltage switch circuits are formed by decomposing logic into a set of interrelated Boolean expressions, each of which is implemented as a binary decision tree of interconnected differential pairs. A differential pair comprises a pair of transistors with differential inputs and common source. The input to each pair is a differential signal which switches on one of the transistors. The result is the creation of a unique conducting path through the tree. The tree output signals indicate the true and complement values of the Boolean function which has the control signals as its variables.

DCVS trees are typically assembled from n-channel differential pairs and p-channel loads. For a discussion of DCVS tree design, the following two references may be referred to for background information.

[1] L. G. Heller, W. R. Griffin, J. W. Davis and N. G. Thoma, "Cascode Voltage Switch Logic: A Differential CMOS Logic Family," 31st IEEE International Solid-State Circuits Conference, Digest of Technical Papers, 1984, pp. 16–17.

[2] C. K. Erdelyi, W. P. Griffin and R. D. Kilmoyer, "Cascode Voltage Switch Logic Design," *VLSI Design*, v. V, 1984, pp. 78–86.

The logic designer, or design program, can synthesize logic by constructing from these elements the particular set of trees which leads to the most efficient design. Trees make extensive use of internal dotting, and thus make powerful circuits, such as XORs and parity trees. The number of stages and the associated delay decrease in direct proportion to the functionality of the trees. Because of the diversity of functions which can be synthesized, DCVS combines the simplicity of having a small number of basic circuit elements with the efficiency of design afforded by a large circuit library.

As noted above, the functional power of DCVS trees derives from the dotting provided by the extensive interconnection of the transistor pairs. The price paid for this otherwise free computing power is local congestion near the transistor pairs. When all wiring shares the same tracks, this congestion impedes the wiring of the gate input signals, which originate from other trees. One of the hallmarks of DCVS logic is the large number of input variables associated with each tree. Moreover, the true and complement of each variable occur as distinct nets, and these nets typically have large fanout within a macro design. The two factors of dense global and internal tree wiring combine to limit the achievable circuit density for all but relatively small DCVS macros.

The key to obtaining high densities with DCVS is to remove or reduce the congestion caused by the complex internal tree wiring and to maximize the efficiency of wiring the differential inputs of the transistor pairs.

Previous attempts to improve the wirability of DCVS trees has involved the local customization of the trees in which their structures are changed so as to simplify global wiring. There was also some consideration given to complexity of internal tree wiring, but in practice, the global considerations override any of those considerations. The present invention does simplify internal wiring in a direct and telling manner.

The previous technique involves logical recon firguration and is referenced in the subsequent prior art section. (IBM Technical Disclosure Bulletin article Vol. 27, No. 3, Aug. 84).

As stated previously, DCVS chips are difficult to wire because of the high density of contacts. For many images, DCVS trees are allotted a fixed area, called a tree accounting area (TAA). For small collections of trees, all connections, internal and external to the trees, are wirable in two levels of metal, with wiring space (porosity) left over. As practical sizes are approached, the porosity decreases until a size is reached where all the wiring space is used, and the design becomes unwirable. In standard cell designs, some of the internal (source-drain) connections are wired in diffusion, decreasing the metal-wire space usage.

There is, accordingly, continuous pressure on logic and chip design professionals to provide improved design tools which will increase the wirability of DCVS logic trees and thus achieve the highest possible density of resultant chips.

DESCRIPTION OF THE PRIOR ART

U.S. Pat. No. 4,441,207, "Design Rule Checking Using Serial Neighborhood Processing" of Lougheed et al solves the problem of integrated circuit design rule checking. That is, it presents a method for verifying that an existing device layout obeys all rules governing feature and spacing geometries at the integrated circuit mask level. Because VLSI chips tend to be very complex with many shapes to check, a method of serial neighborhood processors is used to attack the data volume/computation speed problem.

In contrast, the present method does not deal at all with the subject of checking or verification. Rather, it is a method for generating the layout for an integrated circuit design. It presents a method for constructing the layout of the devices on a chip.

Also, the disclosed procedure does not use a computation method even remotely similar to the serial neighborhood processors described in the above patent. The embodiment of the disclosed method is a single program run on one processor.

The amount of data examined at any given time is very small; many orders of magnitude fewer items must be considered than in the shapes checking problem. The method would not benefit from any of the computational procedures described in the U.S. Patent.

An article in the *IBM Technical Disclosure Bulletin* Vol. 27, No. 3, August 1984, page 1572 by the present inventors entitled "Method for Improving Cascode Switch Chip Design" relates generally to the area of automated DCVS chip design, however, this article is concerned with the selection of a tree to implement a logical expression and not with chip density, wiring simplification, reliability, etc., as is the case with the present invention. Thus, the present invention would be used after the tree selection has been made by a method such as the one disclosed in the above article.

Another article in the IBM Technical Disclosure Bulletin Vol. 27, No. 7A, December 1984, page 3775 by Hauge et al entitled "Two-Dimensional Layout of Single Ended CVS Trees in Masterslice and Means for Realizing a Compact Master Image Layout Using Two-Dimensional Diffusion Wiring" describes the use of diffusion wiring techniques for single ended not differential CVS trees. It thus does not consider the wiring possibilities available with DCVS circuit trees.

U.S. Pat. Nos. 4,484,292 and 3,653,071 and the *IBM Technical Disclosure Bulletin* by Fitzgerald et al, Vol. 27, No. 1B, June 1984, page 497 entitled "Interwoven Word Lines on RAM Chip" all relate generally to the field of VLSI circuit design, however, none is related to the present concepts of improving chip wirability by mirroring and relocation of pairs on the chip.

OBJECTS OF THE INVENTION

It a primary object of the present invention to provide a method for designing DCVS logic trees implemented in CMOS technology having improved wirability.

It is a further object to provide such a method which improves the inherent reliability of the resultant circuits.

It is yet another object of the invention to provide such a method which increases the circuit densities achievable in such VLSI structures thus reducing manufacturing costs.

It is another object of the invention to provide such a method of producing DCVS logic circuits which maximizes the number of connections which can be made in diffusion and minimizes the number which must be made with wire o metal conductors. Other objects, features and advantages of the invention will be apparent from the following description thereof as set forth in the accompanying figures.

SUMMARY OF THE INVENTION

Present invention solves the wirability problem of CMOS differential cascode voltage switch logic circuits significantly reducing the numbers of wire crossing necessary to produce final logic circuit tree design, thus allowing in essence, the planarization of the interconnection wiring. This allows as many of the internal tree connections as possible to be planarized which in turn allows the interconnections to be made using diffusion rather than metal wiring. It eases the metal wiring task by reducing the number of metal nets, and by removing the metal blockages associated with diffusion-metal-contacts which obviously are not needed when connections are wired directly using diffusion processes.

The method takes advantage of differential pair and load microblocks which have been designed so as to allow mirroring on a vertical centerline. The mirroring concept provides that the locations of the true and complement differential pair outputs can be exchanged without changing track assignments for true and complement input connections. To be explained more clearly subsequently, the concept of mirroring either the load or the individual differential pairs together with the relocation of individual differential pairs results in a significant reduction in line crossings. Of course, it means that the connections network is largely planarized, thus, leading to diffusion wiring. The resulting circuit retains input variable alignment for busing. The connection points for the true and complement load inputs can be exchanged without detriment to chip wirability. Although the load output track assignments are exchanged, the load outputs are wired in metal and connect to other trees, and they have no preferred order.

According to the method, a tree circuit being optimized is arranged in input format with the load at the top of the individual differential pairs which are arranged in row and column format and an initial interconnection wiring patterning dictated solely by the requirements of the Boolean function being performed by the circuit. It analyzes the circuit, systematically causes various differential pairs to be mirrored or relocated according to heuristics, which by examination have been shown to lead to elimination of line crossings and shortening of interconnections.

BRIEF DESCRIPTION OF THE DRAWINGS

FIGS. 5A through 5F illustrate the intermediate and end results of the present invention on the layout of a typical DCVS tree utilizing the concepts of relocation and mirroring in a set of schematic interconnection diagrams.

DESCRIPTION OF THE PREFERRED EMBODIMENT

According to the present invention, a method for increasing the wirability of CMOS master-image differential cascode voltage switch (DCVS) circuits is disclosed. The object of the method is to permit as many of the internal tree (book) connections as possible to be wired using diffusion. This is accomplished by finding a layout for the differential transistor pairs and load devices on a regular image such that the maximum possible number of diffusion connections can be made. This eases the metal wiring task by reducing the number of metal nets, and by removing the metal blockages associated with diffusion-to-metal contacts which are not needed when connections ar wired directly in diffusion.

The invention reduces the overall metal wire congestion which in turn leads to higher wirable logic densities. Diffusion wiring of 95% of the internal DCVS tree connections has been achieved experimentally. This accounts for approximately 50% of the chip connections.

Figure 1:
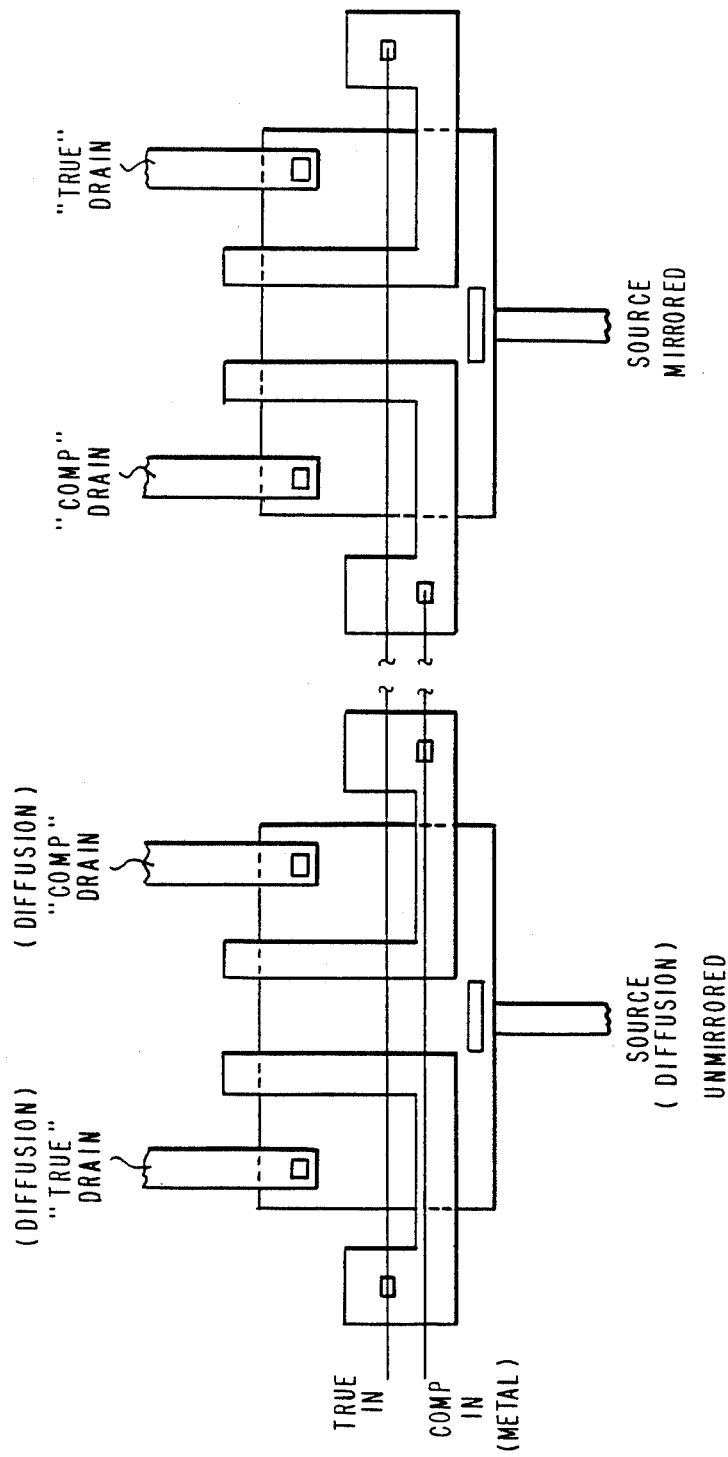
FIGS. 1A and 1B comprise a top view of an "unmirrored" and "mirrored" n-type differential transistor pair respectively.
Figure 2:
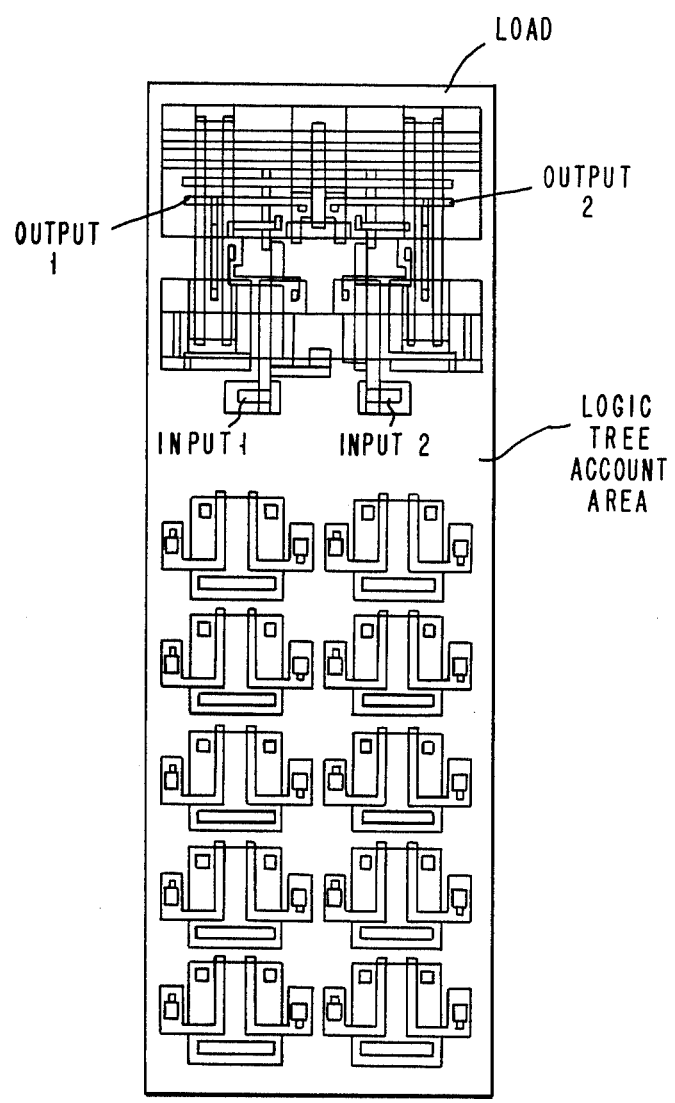
FIG. 2 comprises a top view of a DCVS tree (much enlarged) showing the individual DCVS differential transistor pairs located symmetrically with the load in the tree accounting area.

The method takes advantage of differential pair and load microblocks which have been designed so as to allow mirroring on a vertical center line. The differential pair and load designs are shown in FIGS. 1A and 1B, and the top of FIG. 2. As can be seen from FIGS. 1A and 1B, the locations of the true and complement differential pair outputs can be exchanged without changing track assignments for true and complement input connections. This is important because it retains input variable alignment for bussing. Similarly, the connection points for the true and complement load inputs can be exchanged since exchanging the load output track assignments does not affect the chip wirability. FIG. 2 illustrates a tree accounting area (TAA) indicating the allowed positions for pairs and loads in a DCVS tree.

In some master image CMOS design methods (see for example T. Uehara and W. M. VanCleemput, "Optimal Layout of CMOS Functional Arrays", *IEEE Transactions on Computers*, C30,305–312 (1981)) diffusion connections within a book are made in a single direction, with the remaining connections wired in metal. In contrast, the layout scheme shown in FIG. 2 permits diffusion wiring in two dimensions. The method takes advantage of this property with the result that a greater percentage of the internal book connections may be wired in diffusion.

The internal tree network is planarized, consistent with its connectivity and the constraints of the image. This is done, one tree at a time, by specifying row and column locations for the pairs within the TAA and by mirroring the pairs and load so as to increase the number of connections wirable in diffusion.

Because diffusion can be used for just one layer of wiring, different nets on this level cannot physically cross. In maximizing the number of diffusion connections, the layout method must take this fact into account. Also, because the trees are placed adjacently on the chip image (so as to maximize the circuit density on the chip), care must be taken to ensure that the generated layout for any given tree does not require wiring in diffusion that would encroach upon a neighboring tree.

Figure 6:
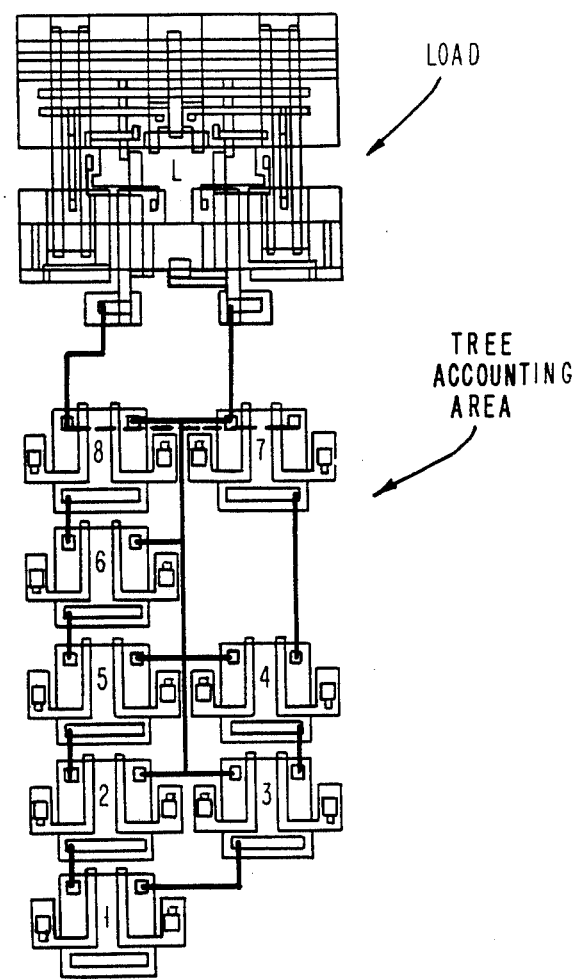
FIG. 6 comprises a view of an enlarged DCVS tree which was designed utilizing the present invention and is the same as illustrated in the schematic interconnection diagram of FIG. 5F.

The n-type differential pairs and p-type load which make up a DCVS tree are laid out within tree accounting areas (TAA) in a regular array on the DCVS image, as shown in FIGS. 2 and 6.

For electrical reasons, the maximum logical height of a tree (i.e., number of n-transistors in series) is limited to five; because of the relationship between logical and physical level within the tree, the physical tree height on the image is also limited to five. The tree can be as wide as required. That is, a tree may occupy two or more adjacent TAA's in some cases.

The trees are laid out independently, one at a time. For each tree, the inputs to the disclosed procedure are (a) the logical level of each differential pair and (b) the source and drain connections of the pairs, including the connections to the load device. The logical level of a pair is the maximum number of transistors through which a signal passes from a drain of that pair to ground. Drains of differential pair devices connect either to the source of another pair or to one of two load device inputs. Contacts to sources and drains of the differential pairs and to the inputs of the load devices from the pairs can all be made in diffusion if the interconnection wiring required permits this. FIG. 6 clearly illustrates the resultant diffusion wiring.

As stated above, the loads and differential pairs are designed to be mirrorable in place about their vertical center axis. This permits either load input signal to be at the left side of the load, and either drain output signal to be at the left side of the pair. Because of the arrangement of the gate contacts on the transistors in the pair, this mirroring can be accomplished with no impact on the metal wiring to the gates. (SEE FIGS. 1A and 1B)

Figure 4:
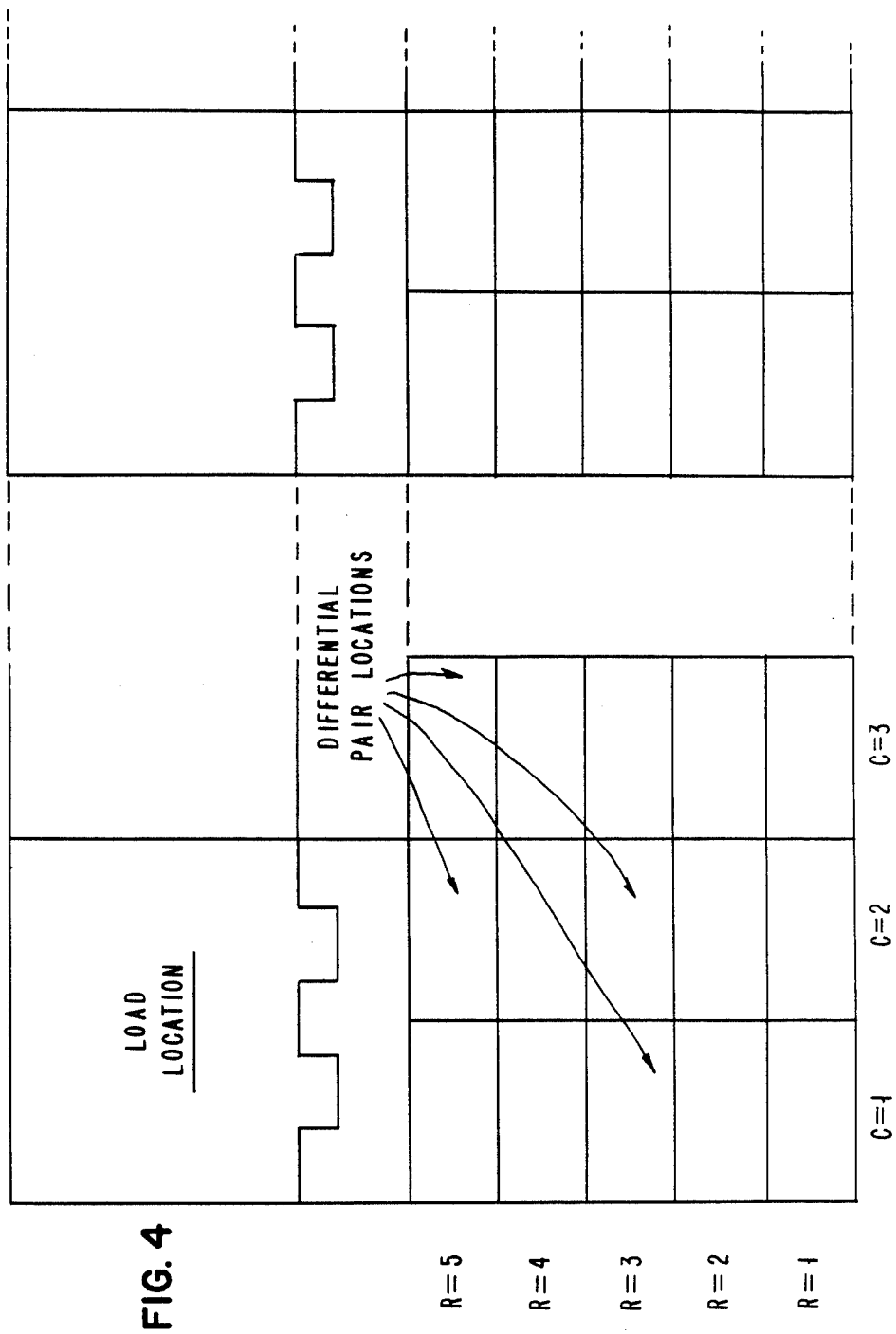
FIG. 4 illustrates the graphical layout approach utilized by the present method wherein the initial circuit design is first placed in a particular format.

Before proceeding with a detailed discussion of the present method, there will follow a functional description of the method in terms of what procedural steps occur in determining the decisions as to whether a particular pair or the load should be mirrored or a particular pair should be relocated to a different row or column of the tree. Reference should be made to FIG. 4 for a graphical representation of the tree construction and the row and column assignment protocols.

GENERAL DESCRIPTION OF METHOD (1) Row and Column Assignment

The pairs are initially positioned within the TAA so that their physical rows have the same sequence as their logical levels in the tree. That is, the pair connected to ground is placed beneath all other pairs (e.g., row 1). Each pair is placed on as low a row (or level) as is consistent with the requirement that the drains of each pair connect to sources of pairs which lie on higher rows within the TAA. In order to promote horizontal variable input bussing between neighboring trees, pairs on some of the rows within the TAA may be moved to other rows, so long as the row sequencing is maintained. (In some cases, some but not all pairs on a given row may be moved to a higher row.)

Consistent with the maximum amount of bussing obtainable from the above row sliding, pairs are assigned to rows so as to reduce the amount of diffusion capacitance (wire length) within the tree. The total tree height is fixed by the height of the TAA. The following constraints are imposed in order of decreasing priority: (a) The ground-to-tree connection length is maximized; (b) The pairs comprising the tree are kept on contiguous rows. The explanation of this is: suppose there are two levels in the tree. Suppose the first level is fixed to the bottom row due to busing constraint to a neighboring tree. (Busing consideration overrides maximizing ground-to-tree connection length (a)). The second-level transistor pair is placed on row 2 (constraint (b)) because rows 1 and 2 are contiguous, rather than on row 5 (constraint (c)) which would minimize the distance from the load to the top pair; (c) The distance from the load to the top pair is minimized and (d) Any topmost pair in the rightmost column connecting only to the load is moved to the highest occupied row in the TAA.

Pairs in each row are assigned to particular columns so as to minimize the horizontal wire length of connections to pairs higher in the tree.

(2) Initial Mirroring

The tree is scanned from ground up. When the drain connections of a pair cross, the pair is mirrored to remove the crossing. As seen in FIG. 2, the two load input pin locations align with the two columns of pairs in the TAA. The load is mirrored if more connections come from the opposite columns of pairs than from the columns directly under the load inputs.

(3) Final Mirroring

In the final part of the procedure, each of a series of criteria for mirroring is applied, in order of decreasing importance, to all of the pairs. When a criterion applies to a pair, the pair orientation is fixed and subsequently not changed.

(1) Pairs in the left column of the TAA are mirrored when doing so will (a) Uncross drain connections when one or both are connected to the load (for this purpose, the two load inputs are taken to be at the far left and the far right of the tree); (b) Move a drain to the right if it is connected to a drain on the same row in the right column of pairs or (c) Move a drain to align with another drain in the left column of pairs to which it is connected.

(2) Pairs in the right column of the TAA are mirrored when doing so will (a) Move a drain to the left if it is connected to the right drain of a pair on the same row; (b) Move a drain to align with another drain to which it is connected in the right column of pairs or (c) Move a drain of the top pair in the right column to the right if it connects to the load and the other drain of the pair does not connect to the load.

(4) Special Considerations For Nonplanar Connections

Figure 3A:
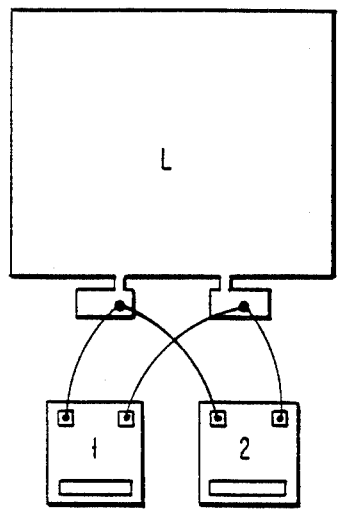
FIG. 3A shows a frequently-occurring set of connections which cannot be planarized, so that at least one connection must be made in metal.
Figure 3B:
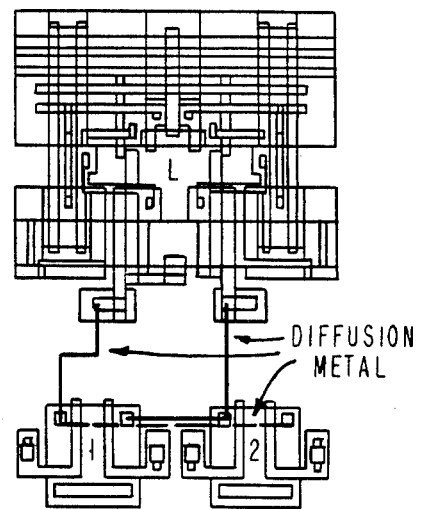
FIG. 3B shows the final configuration produced by the invention. Note that differential pair 2 has been mirrored.

A situation which occurs often in tree structures gives rise to a nonplanar set of connections. This occurs when two pairs on the same row have the same output connections. Frequently the pairs are on the top row, and the outputs go to the load. This is shown in FIG. 3A. Because of the nonplanarity, no combination of placement and mirroring will provide a layout which can be wired totally in diffusion. Steps (1b) and (2a) above ensure that the wiring can be accomplished in a simple manner by connecting the two outer drain contacts with one horizontal metal segment. The two inner drains are connected in diffusion. The wired configuration is illustrated in FIG. 3B.

The output of the disclosed method is a final row (R) and column (C) position within the tree area for each differential pair, and a flag MP and ML signalling whether each pair and load, respectively, is to be mirrored in place about its vertical center axis. The row and column numbering scheme is shown in FIG. 4. Mirroring of a pair or load will be designated by circling the device number (or the L for the load).

DETAILED DESCRIPTION OF THE METHOD

The trees are examined one at a time, beginning with an original non-mirrored layout resulting from only the requirements of the Boolean logic performed by the tree. The interconnectivity (i.e., logic) of the individual pairs must, of course, be entirely accurate. A control program extracts for each tree the logical level of the pairs in the tree and their connectivity. As a starting point, the pair row R is set equal to its logical level. The column position C on each row is specified by arbitrarily ordering from left to right all of the pairs on that row. The width of the tree is then the maximum C which occurs for any R in the tree. The row and column designations may be clearly seen in FIG. 4. At the start, all devices are unmirrored (ML=MP=0). (The convention is that the unmirrored load, ML=0, has its true input (L1) at the left, and complement (L0) at the right.)

The control program passes action to one of two programs, depending on the width C of the tree. If C=1, then ONEWIDE is executed. Else, MANYWIDE is executed.

ONEWIDE (procedure for trees one column wide)

For these trees, the initial values of R and C cannot be improved upon for diffusion wiring, i.e., no relocation is necessary. Thus, ONEWIDE specifies only the pair and load mirroring flags ML and MP.

ONEWIDE consists of three steps:

Step 01. For each pair: If one or both drains connect to the load, then it is SET. MP of the pair is specified such that the pair aligns with the load. (The meaning of "it is SET" is that the criterion of this Step applies to a pair; not that the criterion is met. Thus, the pair is to BE SET here by mirroring (or not) according to whether the criterion is or is not already met. It may not end up mirrored, but it is nevertheless "SET". The consequence of a pair having been SET is that no further Steps are taken with respect to that pair.

Note: A pair is "aligned" with a load (given the load's current state of mirroring) if its left drain is connected to the left input to the load, if its right drain is connected to the right input to the load, or if both these conditions are met.

Step 02. For each pair that has not been SET: If one or both drains connect to the same signal as the drains of a pair already SET, then SET the current pair. MP of the current pair is specified so as to place the drain signal(s) on the same side as the drain signal(s) in that previously SET pair.

Step 03. If the tree layout requires more than one vertical diffusion wiring track to the left of the tree, then the entire tree, with its current values of ML and MP, is mirrored (ML and MP are replaced by their complements). Else, MP remains as specified by Steps 01 and 02, and ML=0.

Note: Because a load device is as wide as two differential pairs, each tree must occupy an area on the image which is at least 2 columns wide. Since the column to the right of the pairs in a one-wide tree will be empty of pairs, there is sufficient room for more than one vertical diffusion wiring track. However, only one track is available to the left of the tree, as another tree occupies that position and might require the track for its own diffusion wiring.

MANYWIDE (procedure for trees more than one column wide)

The procedure for these trees is more complex than that for the one-wide trees. Improved values for R and C, as well as for ML and MP, are specified.

To illustrate the action taken by the steps in MANYWIDE, the layout of a two-wide tree is given as an example. The tree before executing MANYWIDE is shown in FIG. 5A. The source and drain contacts, and internal tree connections are indicated.

MANYWIDE consists of six steps:

Step M1. For the topmost pair in each column: If the pair drains are connected only to the load, then raise the pair to the highest row occurring for any pair in the tree. However, do not take this action if the pair has gate variables in common with another pair in its original row. This means that in FIG. 5A if pairs 6 and 7 have the same input signal (metal wire connections to the gate contacts, not shown) then pair 7 would be kept on its original level rather than raised to the top level next to pair 8. Raising pair 7 (as explained above) in that case would complicate (impact) the metal wiring task to a greater degree than it would be simplified by having a configuration more favorable for diffusion wiring. It is assumed here pairs 6 and 7 do not have the same gate connections, so that pair 7 is raised up one level.

The state of the example tree after this step is shown in FIG. 5B.

Note 1: This step is preliminary to making a cross-coupled pair link configuration, which will be completed in Step M6e (see FIG. 3B). This configuration is especially desirable because it can be wired with just one horizontal metal segment, the minimum possible for the required set of connections.

Note 2: Metal wirability is improved when transistor gates having common signal inputs lie on the sam horizontal wiring track. This benefit outweighs the advantage to be gained from creating cross-coupled pairs.

Step M2. This step specifies the final values of C for the pairs in the tree. For each row, starting from the second highest row in the tree and proceeding downward: A preferred value of C is calculated for each pair in the row by averaging the Cs of the pairs (or load) to which it connects. (For this step, both L1 and L0 are taken to be at the center of the tree, e.g., midway between the outer edges of the required columns or, stated differently, equally close to columns 1 and 2.) Pairs are assigned C's as close as possible to the preferred columns, and always in the preferred order across the row.

Figure 5C:
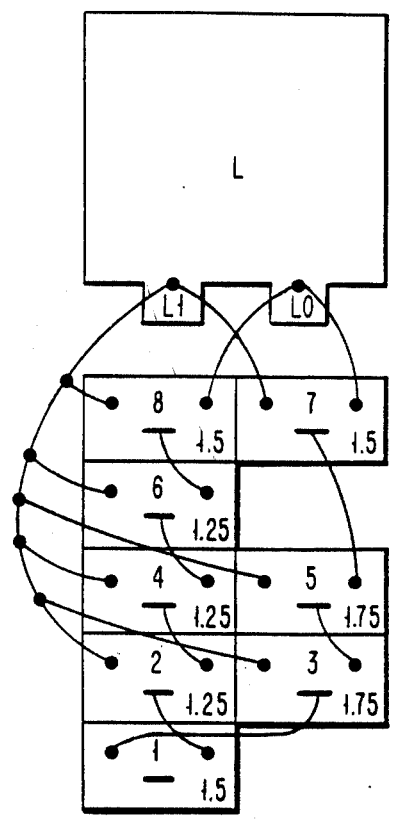

The preferred values of C for the pairs in the example tree are indicated in FIG. 5C, and the state of the example tree after this step is shown.

Note: Drains always connect to pairs on one or more higher rows, the C's of which will always have been previously specified.

Step M3. This step specifies the final values of R for the pairs in the tree. It consists of repeating Step M1 with the new column assignments.

This step does not alter the example tree.

Step M4. For each pair: If the right drain of the pair connects to a pair in a column which is to the left of the column of the pair to which the left drain connects, then the current pair is mirrored. Else, it is not mirrored. For this step, the load is assumed to be in the same column as the current pair.

Figure 5D:
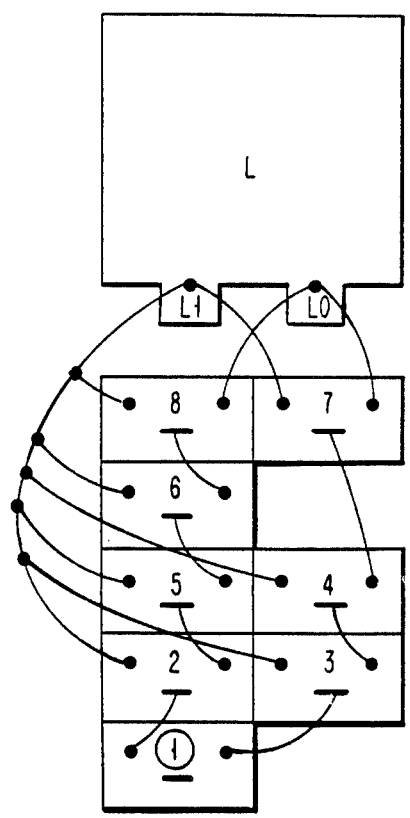

The state of the example tree after this step is shown in FIG. 5D. Mirroring is indicated by a circled pair number.

Step M5. This step specifies the final load mirroring ML.

Step M5a. If there are more connections from column-2 pairs to L1 than to L0, then mirror the load and proceed to Step M6. Else, continue.

Step M5b. Repeat Step M5a, but discount any connections from a pair to the load if the pair to its left makes the same load connection.

Step M5c. If there is a column-2 pair which connects to L1 and which is on a higher row than all column-2 pairs which connect to L0, then mirror the load and proceed to Step M6. Else, continue.

Step M5d. Find the highest row on which there is no pair in column 2, but a higher row does contain a pair in column 2; and on which the pair in column 1 connects to the load. If the column-1 pair makes a connection to L0 but not to L1, then mirror the load. Else, the load is not mirrored. (An example of this situation is shown in Table I below where the pair in row 3 (not row 5) meets this condition.)

TABLE I

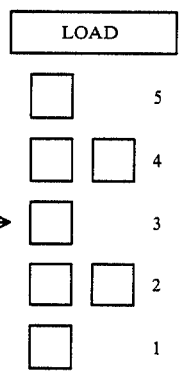

Figure 5E:
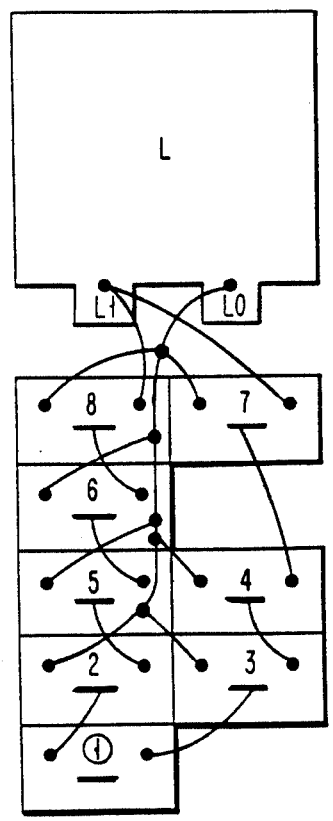

The state of the example tree after this step is shown in FIG. 5E. The load was mirrored in Step M5A.

Step M6. This step specifies the final pair mirroring MP. It takes as input the pair mirroring specified in Step 4. (In Step 5, only the load can be mirrored.) Therefore, if Step 6 requires that a pair be mirrored, and it was mirrored in Step 4, then its final state is unmirrored. All pairs start with flag SET=0. Once a pair has been SET (SET=1), it is never again considered for mirroring.

Steps M6a-d mirror the pairs in column 1.

Step M6a. SET each column-1 pair connected to the load. If the pair is not aligned with the load (see Note for Step 01), then MP is specified so that the pair aligns with the load.

Figure 5F:
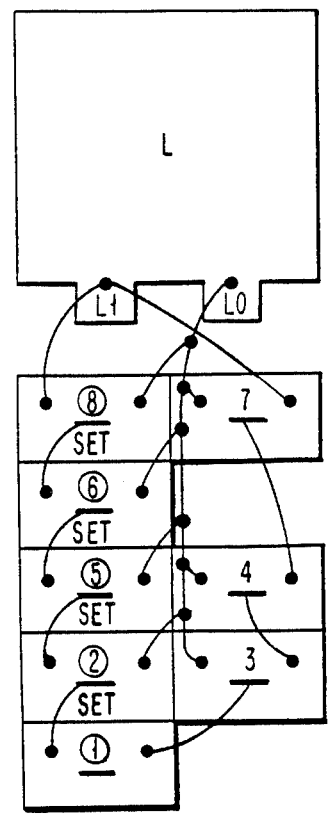

The state of the example tree after this step is shown in FIG. 5F. SET pairs are indicated.

Step M6b. For each pair in column 1 which has not been SET: If one or both drains connect to the same signal(s) as the drain(s) of a pair already SET, then SET the current pair. MP of the current pair is specified so as to place the drain signal(s) on the same side as the drain signal(s) in a previously SET pair.

Step M6c. For each pair in column 1 which has not been SET: If a drain connects to the same signal as a drain of the pair in column 2 of the same row, then SET the current pair. MP of the current pair is specified so that the drain with the shared signal is on the right.

Step M6d. For each pair in column 1 that has not been SET: If one or both drains connect to the same signal(s) as the drain(s) of a pair already SET, then SET the current pair. MP of the current pair is specified so as to place the drain signal(s) on the same side as the drain signal(s) in a previously SET pair. Finally, all column-1 pairs with SET=0 are SET.

Steps M6e-i mirror the pairs in column 2.

Step M6e. For each pair in column 2: If both drains connect to the same signals as the drains of the pair in column 1 of the same row, then SET the current pair. MP of the current pair is specified so that the drain outputs occur in the opposite order from those in column 1. If all pairs have been SET, then go to Step M6i.

The state of the example tree after this step is unchanged from FIG. 5F, with the exception that pair 7 is SET.

Note: This step creates the cross-coupled pair link configuration.

Step M6f. For each pair in column 2 which connects to the load and has not been SET: If the right-hand drain of a pair in column 1 of the same row connects to the same load input as either of the drains in the current pair, then SET the current pair. MP of the current pair is specified so that the drain with the shared signal is on the left. If all pairs have been SET, then go to Step M6i.

The state of the example tree after this step is unchanged from FIG. 5F, with the exception that pairs 3, 4 and 7 are SET.

Step M6g. For each pair in column 2 which has not been SET: If the right-hand drain of a pair in column 1 of the same row connects to the same signal as either of the drains in the current pair, then SET the current pair. MP of the current pair is specified so that the drain with the shared signal is on the left. If all pairs have been SET, then go to Step M6i.

Step M6h. For each pair in column 2 which has not been SET: If one or both drains connect to the same signal(s) as the drain(s) of a column-2 pair which has been SET, then SET the current pair. MP of the current pair is specified so as to place the drain signal(s) on the same side as the drain signal(s) in the previously SET pair.

Step M6i. Consider the highest pair in column 2. If it has one and only one connection to the load and does not have the same drain connections as the pair on its left in the same row, then continue with this step. Else, MANYWIDE is completed. MP of the current pair is specified so that the drain connected to the load is on the right.

Figure 7:
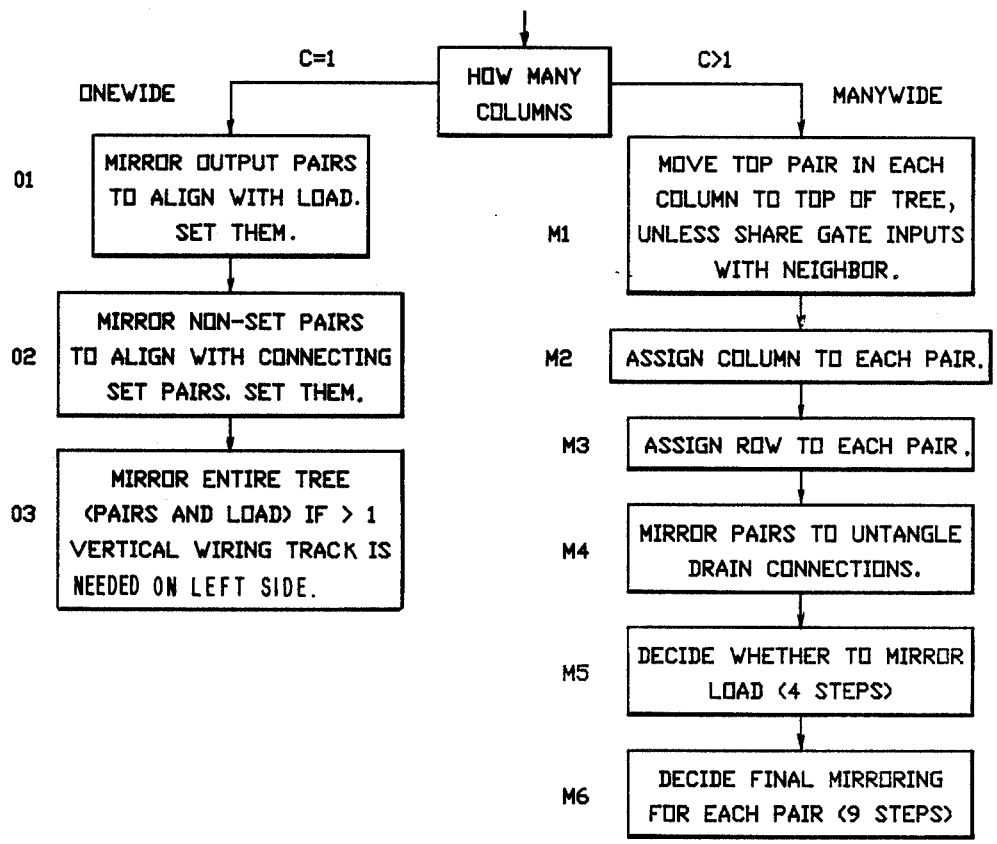
FIG. 7 comprises a high level flowchart of the 'mirroring' procedure of the present invention.

Steps M6g–i do not affect the example tree, so that the tree (R, C, ML and MP) shown in FIG. 5F represents the final layout. Note that only the connection from pair 7 to L0 crosses another net. Pairs 7 and 8 are cross-coupled and are thus wired as shown in FIG. 3B. The remainder of the tree is wired entirely in diffusion, as shown in FIG. 6. See FIG. 7 for a high level flowchart of the procedure. It will be noted that steps M5 and M6 in this MANYWIDE procedure are not specifically shown as they are shown and discussed in detail above.

When trees have more than 2 pairs on any logical level, the procedure is like the 2-wide case, modified as follows:

| Step | Operations |
| --- | --- |
| 1 | Row and column assignment for pairs (Steps M1–M3) |
| 2 | Initial pair mirroring (Step M4) |
| 3 | Store the column assignments of the pairs |
| 4 | Reassign columns by filling each row from the left (column 1) with no spaces |
| 5 | Mirror load on basis of first 2 columns (Step M5) |
| 6 | Final mirroring of pairs in columns 1 and 2. (Step M6) This applies only to columns 1 and 2. |
| 7 | Mirror columns 3,4 . . . (Step 7 is derived from the procedure for mirroring the column-2 pairs in the 2-wide case: Suppose after Step 4 the pattern of differential pairs is as shown in Table II below and Step 6 has mirrored the pairs in column 1 and column 2. Consider columns 2 and 3 as if they were columns 1 and 2. Perform the "column-2" Steps (Steps M6e–M6i) on column-3 pairs, leaving the column-2 pairs fixed as previously set. If there are column-4 pairs, repeat, mirroring the column-4 pairs as if they were column 2 in the Steps M6e–M6i, leaving the column-3 pairs as previously set. Continue with this procedure, taking columns m and m + 1 (where m is, in sequence 2,3,4 . . . ) until m + 1 is the maximum number of pairs in a row. The procedure is to execute Steps M6e–M6i, treating column m as column 1, and column m + 1 as column 2. In these steps, only the pairs in column m + 1 are changed; the pairs in column m are left as previously set. |
| 8 | Restore column assignments from Step 3. |

TABLE II

|   | 1 | 2 | 3 |
| --- | --- | --- | --- |
| 5 | □ | □ |   |
| 4 | □ | □ | □ |
| 3 | □ | □ | □ |
| 2 | □ | □ | □ |
| 1 | □ |   |   |

CONCLUSIONS

A method has been described for increasing the wirability of DCVS master-image circuits by determining a favorable placement and orientation for each microblock in order to maximize the number of connections wired in diffusion. The procedure has been written into a program and exercised on over 1000 DCVS trees. Typically 95% of the internal tree connections were wired in diffusion. This reduces by approximately 50% the number of chip connections which must be wired in metal. Using this method, large collections of trees have been wired completely (diffusion and metal) without having to provide extra wiring space by leaving tree accounting areas intentionally unoccupied.

Having thus described our invention, what we claim as new, and desire to secure by Letters Patent is:

1. A method for improving the wirability of CMOS differential cascode voltage switch logic circuits, comprising a load and a plurality of differential switching pairs, which perform a predetermined Boolean logic function said method being operable to significantly reduce the number of wire crossings in the final logic circuit tree design and to allow as many of the internal tree connections as possible to be made using diffusion wiring, said method comprising; first arranging the tree circuit to be optimized in an input format with the load at the top of the individual differential pairs, arranging said differential pairs in row and column format, initially defining an interconnection wiring pattern dictated solely by the requirements of the Boolean function being performed by the circuit, with the load and all differential pairs arranged with true and complement input, and outputs on the same side, next locating all of the differential pairs in rows corresponding to their logic level in the Boolean descriptions of the circuit, next relocating certain differential pairs to shorten interconnections, and next mirroring certain differential pairs to eliminate line crossings, and finally, mirroring the entire logic circuit so produced whereby input and output connections may be altered to enhance interfacing with adjacent circuitry.

2. A method for improving the wirability of CMOS differential cascode voltage switch logic circuits to significantly reduce the number of wire crossing in the final logic circuit tree design to allow as many of the internal tree connections as possible to be made using diffusion wiring, said method comprising;

initially specifying a non-mirrored layout for the tree as required by the Boolean logic function performed by the tree, extracting for the tree the logical level of each of the pairs in the tree and their connectivity, assigning a row R to each switching pair equal to its logical level, assigning a column position C on each row to each pair by arbitrarily ordering from left to right all of the pairs on that row, the unmirrored convention being that the unmirrored load and all pairs have their true inputs and outputs at a first side, and their complement inputs and outputs at the other side, the mirrored or unmirrored conditions of the load and all pairs being specified by a value assigned to the constant ML and MP for the load and the individual pairs, respectively, the method branching to one of two possible procedures depending on the width C of the tree, when C=1 the procedure ONEWIDE being followed, otherwise MANYWIDE being followed, wherein the procedure ONEWIDE comprises;

first examining each pair and if one or both drains connect to the load, then causing it to be SET so that the MP of the pair is specified such that the pair aligns with the load, examining each pair that has not been SET and if one or both drains connect to the same signal as the drains of a pair already SET, causing the current pair to be SET so that the MP of the current pair is specified so as to place the drain signal(s) on the same side as the drain signal(s) in that previously SET pair, and finally determining if the tree layout of this tree requires more than one vertical diffusion wiring track on a predetermined side of the tree, and if so, causing the entire tree, with its current values of ML and MP, to be mirrored so that the current values of ML and MP are replaced by their complements.

3. A method for improving wirability as set forth in claims 2 wherein the second possible procedure to which the procedure may branch is MANYWIDE which is utilized when trees are more than one column wide, (C>1) said MANYWIDE procedure comprising;

(1) first selecting, as the initial subject for treatment, a tree two columns wide wherein the leftmost two pairs in each row are processed, (2) determining for the topmost pair in each column, if the pair drains are connected only to the load, and is so, raising the pair to the highest row occurring for any pair in the tree unless the pair has gate variables in common with another pair in its original row, (3) for each row, starting from the second highest row in the tree and proceeding downward, calculating a preferred value of C for each pair in the row by averaging the Cs of the pairs (or load) to which it connects, considering both L1 and L0 as being at the center of the tree, (4) assigning pairs to columns as close as possible to the preferred columns, and always in the preferred order across the row, (5) repeating Step 2 with the new column assignments, (6) performing an initial mirroring operation comprising determining for each pair, if the right drain of the pair connects to a pair in a column which is to the left of the column of the pair to which the left drain connects and if so mirroring, the current pair (for this step, the load is assumed to be in the same column as the current pair), (7) performing load mirroring, (8) performing the final pair mirroring for column 1, (9) performing the final pair mirroring for column 2.

4. A method for improving wirability as set forth in claim 3 wherein the load mirroring step 7 comprises;

(1) determining if there are more connections from column-2 pairs to L1 than to L0, and if so, mirroring the load and proceeding to the column-1 pair mirroring procedure, else continue, (2) repeating Step 1, but discounting any connections from a pair to the load if the pair to its left makes the same load connection, (3) determining if there is a column-2 pair which connects to L1 and which is on a higher row than all column-2 pairs which connects to L0, and if so, mirroring the load and proceeding to the column-1 pair mirroring procedure, else, (4) finding the highest row on which there is no pair in column 2, but a higher row does contain a pair in column 2; and in which the pair in column 1 connects to the load and determining if the column-1 pair makes a connection to L0 but not to L1, and if so, mirroring the load.

5. A method for improving wirability as set forth in claim 4 wherein the final pair mirroring Step 8 of claim 6 comprises;

(1) utilizing as input the pair mirroring results of Step (7) of claim 6, (2) first analyzing and selectively mirroring pairs of column 1, and (3) finally analyzing and selectively mirroring the pairs of column 2.

6. A method for improving wirability as set forth in claim 5 wherein Step 2 comprises;

(1) causing each column-1 pair connected to the load to be SET so that the pair aligns with the load, (2) examining each pair in column 1 which has not been SET, determining if one or both drains of a pair connect to the same signal(s) as the drain(s) of a pair already SET, and if so, causing the MP of the current pair to be SET to the same value as the MP of the previously SET pair, (3) examining each pair in column 1 which has not been SET, determining if a drain connects to the same signal as a drain of the pair in column 2 of the same row, and if so, causing the current column-1 pair to be SET to the MP value which will cause the drain with the shared signal to be on the right, (4) examining each pair in column 1 that has not been SET, determining if one or both drains connect to the same signal(s) as the drain(s) of a pair already SET, and if so, causing the MP of the current pair to be SET to the value that will place the drain signal(s) on the same side as the drain signal(s) in the previously SET pair, and (5) finally, causing all column-1 pairs which are not currently SET to be SET to their current MP values.

7. A method for improving wirability as set forth in claim 6 wherein the final mirroring for pairs in column 2 (Step 3 of claim 5) comprises;

(1) examining each pair in column 2 and determining if both drains connect to the same signals as the drains of the pair in column 1 of the same row, and if so, causing the MP of the current pair to be SET to the complement of the MP value of said pair in column 1, and when all pairs have been SET proceeding to Step 5 otherwise, (2) examining each pair in column 2 which connects to the load and has not been SET, determining if the right-hand drain of a pair in column 1 on the same row connects to the same load input as either of the drains in the current pair, and is so, causing the current pair to be SET to an MP value, which will cause the drain with the shared signal to be on the left, and when all pairs have been SET, proceeding to Step 5, otherwise, (3) examining each pair in column 2 which has not been SET, determining if the right-hand drain of a pair in column 1 of the same row connects to the same signal as either of the drains in the current pair, and if so, causing the current pair to be SET to an MP value which causes the drain with the shared signal to be on the left, and when all pairs have been SET, proceeding to Step 5, otherwise, (4) examining each pair in column 2 which has not been SET, determining if one or both drains connect to the same signal(s) as the drain(s) of a column-2 pair which has been SET, and if so, causing the current pair to be SET to an MP value which places the drain signal(s) of the current pair on the same side as the drain signal(s) in the previously SET pair, (5) examining the highest pair in column 2, determining if it has one and only one connection to the load and does not have the same drain connections as the pair on its left in the same row, if not, terminating the procedure as 'complete', and if so, causing the MP of the current pair to be SET to a value whereby the drain connected to the load is on the right, which 'completes' the procedure.

8. A method for improving the wirability of CMOS differential cascode voltage switch logic circuits to significantly reduce the number of wire crossing in the final logic circuit tree design to allow as many of the internal tree connections as possible to be made using diffusion wiring, said method comprising;

initially specifying a non-mirrored layout for the tree as required by the Boolean logic function performed by the tree, extracting for the tree the logical level of each of the pairs in the tree and their connectivity, assigning a row R to each switching pair equal to its logical level, assigning a column position C on each row to each pair by arbitrarily ordering from left to right all of the pairs on that row, the unmirrored convention being that the unmirrored load and all pairs have their true inputs and outputs at a first side, and their complement inputs and outputs at the other side, the mirrored or unmirrored conditions of the load and all pairs being specified by a value assigned to the constant ML and MP for the load and the individual pairs, respectively, determining if the width C of the tree is greater than 2 (C>2) and if so;

(1) first selecting as the initial subject for treatment a tree two columns wide wherein the leftmost two pairs in each row are processed, (2) determining for the topmost pair in each column, if the pair drains are connected only to the load, and if so, raising the pair to the highest row occurring for any pair in the tree unless the pair has gate variables in common with another pair in its original row, (3) for each row, starting from the second highest row in the tree and proceeding downward, calculating a preferred value of C for each pair in the row by averaging the Cs of the pairs (or load) to which it connects, considering both L1 and L0 as being at the center of the tree, (4) assigning pairs to columns as close as possible to the preferred columns, and always in the preferred order across the row, (5) repeating Step 2 with the new column assignments, (6) performing an initial mirroring operation comprising determining for each pair, if the right drain of the pair connects to a pair in a column which is to the left of the column of the pair to which the left drain connects and if so mirroring, the current pair (for this step, the load is assumed to be in the same column as the current pair), (7) performing the load mirroring, (8) performing the final pair mirroring for column 1, (9) performing the final pair mirroring for column 2,

(10) mirror columns 3. . . n by repeating Step 9 wherein column 1 becomes column m and column 2 becomes column m+1, wherein m=2,3 . . . n-1 and m+1=3,4 . . . n until all n columns are processed.

9. A method for improving the wirability of CMOS differential cascode voltage switch logic circuits to significantly reduce the number of wire crossings in the final logic circuit tree design to allow as many of the internal tree connections as possible to be made using diffusion wiring, said method comprising;

(1) initially specifying a non-mirrored layout for the tree as required by the Boolean logic function performed by the tree, extracting for the tree the logical level of each of the pairs in the tree and their connectivity, (2) assigning a row R to each switching pair equal to its logical level, assigning a column position C on each row to each pair by arbitrarily ordering from left to right all of the pairs on that row, the unmirrored convention being that the unmirrored load and all pairs have their true inputs and outputs at a first side, and their complement inputs and outputs at the other side, the mirrored or unmirrored conditions of the load and all pairs being specified by a value assigned to the constant ML and MP for the load and the individual pairs, respectively, the method branching to one of two possible procedures depending on the width C of the tree, when C=1 the procedure ONEWIDE being followed, otherwise MANYWIDE being followed, wherein the procedure ONEWIDE comprises;

(3) first examining each pair and if one or both drains connect to the load, then causing it to be SET so that the MP of the pair is specified such that the pair aligns with the load, (4) examining each pair that has not been SET and if one or both drains connect to the same signal as the drains of a pair already SET, causing the current pair to be SET so that the MP of the current pair is specified so as to place the drain signal(s) on the same side as the drain signal(s) in the previously SET pair, and (5) finally, determining if the tree layout of this tree requires more than one vertical diffusion wiring track on a predetermined side of the tree, and if so, causing the entire tree, with its current values of ML and MP, to be mirrored so that the current values of ML and MP are replaced by their complements, and Wherein the procedure MANYWIDE comprises;

(6) first selecting as the initial subject for treatment a tree two columns wide wherein the leftmost two pairs in each row are processed, (7) determining for the topmost pair in each column, if the pair drains are connected only to the load, and if so, raising the pair to the highest row occurring for any pair in the tree unless the pair has gate variables in common with another pair in its original row, (8) for each row, starting from the second highest row in the tree and proceeding downward, calculating a preferred value of C for each pair in the row by averaging the Cs of the pairs (or load) to which it connects, considering both L1 and L0 as being at the center of the tree, (9) assigning pairs to columns as close as possible to the preferred columns, and always in the preferred order across the row,

(10) repeating Step 7 with the new column assignments, and then proceeding to Step 11,

(11) determining for each pair, if the right drain of the pair connects to a pair in a column which is to the left of the column of the pair to which the left drain connects and if so mirroring the current pair (for this step, the load is assumed to be in the same column as the current pair), Proceeding to a final load mirroring procedure which comprises;

(12) determining if there are more connections from column-2 pairs to L1 than to L0, and if so, mirroring the load and proceeding to Step 16 else, continue,

(13) repeating Step 12, but discounting any connections from a pair to the load if the pair to its left makes the same load connection,

(14) determining if there is a column-2 pair which connects to L1 and which is on a higher row than all column-2 pairs which connects to L0, and if so, mirroring the load and proceeding to Step 17 else, continue,

(15) finding the highest row on which there is no pair in column 2, but a higher row does contain a pair in column 2; and in which the pair in column 1 connects to the load and determining if the column-1 pair makes a connection to L0 but not L1, and if so, mirroring the load, Proceeding to a final pair mirroring procedure which comprises;

(16) utilizing as input the pair mirroring results of Step 15,

(17) causing each column-1 pair connected to the load to be SET so that the pair aligns with the load,

(18) examining each pair in column 1 which has not been SET, determining if one or both drains of a pair connect to the same signal(s) as the drain(s) of a pair already SET, and if so, causing the MP of the current pair to be SET to the same value as the MP of the previously SET pair,

(19) examining each pair in column 1 which has not been SET, determining if a drain connects to the same signal as a drain of the pair in column 2 of the same row, and if so, causing the current column-1 pair to be SET to the MP value which will cause the drain with the shared signal to be on the right,

(20) examining each pair in column 1 that has not been SET, determining if one or both drains connect to the same signal(s) as the drain(s) of a pair already SET, and if so, causing the MP of the current pair to be SET to the value that will place the drain signal(s) on the same side as the drain signal(s) in the previously SET pair, and

(21) finally, causing all column-1 pairs which are not currently SET to be SET to their current MP values,

(22) examining each pair in column 2 and determining if both drains connect to the same signals as the drains of the pair in column 1 of the same row, and if so, causing the MP of the current pair to be SET to the complement of the MP value of said pair in column 1, and when all pairs have been SET proceeding to Step 26 otherwise,

(23) examining each pair in column 2 which connects to the load and has not been SET, determining if the right-hand drain of the pair in column 1 on the same row connects to the same load input as either of the drains in the current pair, and if so, causing the current pair to be SET to an MP value, which will cause the drain with the shared signal to be on the left, and when all pairs have been SET, proceeding to Step 26 otherwise,

(24) examining each pair in column 2 which has not been SET, determining if the right-hand drain of a pair in column 1 of the same row connects to the same signal as either of the drains in the current pair, and if so, causing the current pair to be SET to an MP value which causes the drain with the shared signal to be on the left, and when all pairs have been SET, proceeding to Step 26 otherwise,

(25) examining each pair in column 2 which has not been SET, determining if one or both drains connect to the same signal(s) as the drain(s) of a column-2 pair which has been SET, and if so, causing the current pair to be SET to an MP value which places the drain signal(s) of the current pair on the same side as the drain signal(s) in the previously SET pair,

(26) examining the highest pair in column 2, determining if it has one and only one connection to the load and does not have the same drain connections as the pair on its left in the same row, if not, terminating the procedure as 'complete', and if so, causing the MP of the current pair to be SET to a value whereby the drain connected to the load is on the right, which 'completes' the procedure,

(27) finally, determining if the tree layout of this tree requires more than one vertical diffusion wiring track on a predetermined side of the tree, with its current values of ML and MP, to be mirrored so that the current values of ML and MP are replaced by their complements.

10. A method for improving the wirability of CMOS differential cascode voltage switch logic circuits to significantly reduce the number of wire crossings in the final logic circuit tree design to allow as many of the internal tree connections as possible to be made using diffusion wiring, said method comprising;

(1) initially specifying a non-mirrored layout for the tree as required by the Boolean logic function performed by the tree, extracting for the tree the logical level of each of the pairs in the tree and their connectivity, (2) assigning a row R to each switching pair equal to its logical level, assigning a column position C on each row to each pair by arbitrarily ordering from left to right all of the pairs on that row, the unmirrored convention being that the unmirrored load and all pairs have their true inputs and outputs at a first side, and their complement inputs and outputs at the other side, the mirrored or unmirrored conditions of the load and all pairs being specified by a value assigned to the constant ML and MP for the load and the individual pairs, respectively, the method branching to one of two possible procedures depending on the width C of the tree, when C=1 the procedure ONEWIDE being followed, otherwise MANYWIDE being followed, wherein the procedure ONEWIDE comprises;

(3) first examining each pair and if one or both drains connect to the load, then causing it to be SET so that the MP of the pair is specified such that the pair aligns with the load, (4) examining each pair that has not been SET and if one or both drains connect to the same signal as the drains of a pair already SET, causing the current pair to be SET so that the MP of the current pair is specified so as to place the drain signal(s) on the same side as the drain signal(s) in the previously SET pair, and (5) finally, determining if the tree layout of this tree requires more than one vertical diffusion wiring track on a predetermined side of the tree, and if so, causing the entire tree, with its current values of ML and MP, to be mirrored so that the current values of ML and MP are replaced by their complements, which completes the procedure;

Wherein the procedure MANYWIDE comprises;

(6) first selecting as the initial subject for treatment a tree two columns wide wherein the leftmost two pairs in each row are processed, (7) determining for the topmost pair in each column, if the pair drains are connected only to the load, and if so, raising the pair to the highest row occurring for any pair in the tree unless the pair has gate variables in common with another pair in its original row, (8) for each row, starting from the second highest row in the tree and proceeding downward, calculating a preferred value of C for each pair in the row by averaging the Cs of the pairs (or load) to which it connects, considering both L1 and L0 as being at the center of the tree, (9) assigning pairs to columns as close as possible to the preferred columns, and always in the preferred order across the row,

(10) repeating Step 7 with the new column assignments, and then proceeding to Step 11,

(11) determining for each pair, if the right drain of the pair connects to a pair in a column which is to the left of the column of the pair to which the left drain connects and if so mirroring the current pair (for this step, the load is assumed to be in the same column as the current pair), Proceeding to a final load mirroring procedure which comprises;

(12) determining if there are more connections from column-2 pairs to L1 than to L0, and if so, mirroring the load and proceeding to Step 6 else, continue,

(13) repeating Step 12, but discounting any connections from a pair to the load if the pair to its left makes the same load connection,

(14) determining if there is a column-2 pair which connects to L1 and which is on a higher row than all column-2 pairs which connects to L0, and if so, mirroring the load and proceeding to Step 17 else, continue,

(15) finding the highest row on which there is no pair in column 2, but a higher row does contain a pair in column 2; and in which the pair in column 1 connects to the load and determining if the column-1 pair makes a connection to L0 but not L1, and if so, mirroring the load, Proceeding to a final pair mirroring procedure which comprises;

(16) utilizing as input the pair mirroring results of Step 15,

(17) causing each column-1 pair connected to the load to be SET so that the pair aligns with the load,

(18) examining each pair in column 1 which has not been SET, determining if one or both drains of a pair connect to the same signal(s) as the drain(s) of a pair already SET, and if so, causing the MP of the current pair to be SET to the same value as the MP of the previously SET pair,

(19) examining each pair in column 1 which has not been SET, determining if a drain connects to the same signal as a drain of the pair in column 2 of the same row, and if so, causing the current column-1 pair to be SET to the MP value which will cause the drain with the shared signal to be on the right,

(20) examining each pair in column 1 that has not been SET, determining if one or both drains connect to the same signal(s) as the drain(s) of a pair already SET, and if so, causing the MP of the current pair to be SET to the value that will place the drain signal(s) on the same side as the drain signal(s) in the previously SET pair, and

(21) finally, causing all column-1 pairs which are not currently SET to be SET to their current MP values,

(22) examining each pair in column 2 and determining if both drains connect to the same signals as the drains of the pair in column 1 of the same row, and if so, causing the MP of the current pair to be SET to the complement of the MP value of said pair in column 1, and when all pairs have been SET proceeding to Step 26 otherwise,

(23) examining each pair in column 2 which connects to the load and has not been SET, determining if the right-hand drain of the pair in column 1 on the same row connects to the same load input as either of the drains in the current pair, and if so, causing the current pair to be SET to an MP value, which will cause the drain with the shared signal to be on the left, and when all pairs have been SET, proceeding to Step 26 otherwise,

(24) examining each pair in column 2 which has not been SET, determining if the right-hand drain of a pair in column 1 of the same row connects to the same signal as either of the drains in the current pair, and if so, causing the current pair to be SET to an MP value which causes the drain with the shared signal to be on the left, and when all pairs have been SET, proceeding to Step 26 otherwise,

(25) examining each pair in column 2 which has not been SET, determining if one or both drains connect to the same signal(s) as the drain(s) of a column-2 pair which has been SET, and if so, causing the current pair to be SET to an MP value which places the drain signal(s) of the current pair on the same side as the drain signal(s) in the previously SET pair,

(26) examining the highest pair in column 2, determining if it has one and only one connection to the load and does not have the same drain connections as the pair on its left in the same row, if not, terminating the procedure as 'complete', and if so, causing the MP of the current pair to be SET to a value whereby the drain connected to the load is on the right, which 'completes' the procedure,

(27) finally, determining if the tree layout of this tree requires more than one vertical diffusion wiring track on a predetermined side of the tree, with its current values of ML and MP, to be mirrored so that the current values of ML and MP are replaced by their complements.

* * * * *